United States Patent [19]
Murase

[11] Patent Number: 5,291,126
[45] Date of Patent: Mar. 1, 1994

[54] PULSE WIDTH MODULATION DRIVING CIRCUIT FOR A CROSS COIL METER

[75] Inventor: Hiroshi Murase, Kyoto, Japan

[73] Assignee: Rohm Co., Ltd., Kyoto, Japan

[21] Appl. No.: 867,449

[22] Filed: Apr. 13, 1992

[30] Foreign Application Priority Data

Apr. 17, 1991 [JP] Japan .................. 3-085415

[51] Int. Cl.$^5$ .................. G01R 11/36; G01R 11/30
[52] U.S. Cl. .................. 324/144; 324/143
[58] Field of Search .............. 324/140 R, 140 D, 143, 324/144, 146, 147, 151 R, 151 A, 154 R, 160, 166, 167, 115, 111; 341/145

[56] References Cited

U.S. PATENT DOCUMENTS

| | | | |
|---|---|---|---|
| 4,096,475 | 6/1978 | Ong | 341/145 |
| 4,230,984 | 10/1980 | Taylor | 324/140 R X |
| 4,532,496 | 7/1985 | Ichinose | 341/145 |
| 4,928,060 | 5/1990 | Ito | 324/144 X |
| 4,991,098 | 2/1991 | Dantzler | 324/146 X |
| 5,017,861 | 5/1991 | Hukuda | 324/143 |
| 5,051,688 | 9/1991 | Murase et al. | |
| 5,097,203 | 3/1992 | Haussmann et al. | 324/144 X |
| 5,121,347 | 6/1992 | Yamamoto et al. | 324/140 R X |

FOREIGN PATENT DOCUMENTS

0061292 9/1982 European Pat. Off. .
2045953 11/1980 United Kingdom .

OTHER PUBLICATIONS

*Patent Abstracts of Japan*, vol. 11, No. 104, JP-A-61 251 321, Nov. 8, 1986.

*Primary Examiner*—Kenneth A. Wieder
*Assistant Examiner*—Warren S. Edmonds
*Attorney, Agent, or Firm*—Oliff & Berridge

[57] ABSTRACT

A meter drive apparatus using a counter for counting reference clocks and a comparator for comparing the output value of the counter and the data indicating a directive target of a meter. The output of the comparator is supplied to steering logic where the sign of a current flowing a drive coil of the meter is determined. When supplying the counted value of the counter to the comparator, parallel bits indicating the counted value are cyclically changed. The output of the comparator is PWM-modulated to drive the meter. The effective frequency of PWM waveform is increased, compared to the direct PWM modulation based on the data indicating the directive target of the meter. With this meter drive apparatus, the frequency of the reference clocks may be relatively low.

18 Claims, 6 Drawing Sheets

PULSE WIDTH MODULATION DRIVING CIRCUIT FOR A CROSS COIL METER

BACKGROUND OF THE INVENTION

1. Field of the Invention

This invention relates to a cross-coil meter including a pair of mutually perpendicular coils for generating a magnetic field and a pointer driven by the magnetic field, and more particularly to a PWM modulation circuit to be used in a meter drive apparatus which drives such a cross-coil meter.

2. Description of the Related Art

A cross-coil meter is currently known which generates a magnetic field by supplying a current through a pair of mutually perpendicular excitation coils and indicates a desired angular bearing by imparting to an angularly movably supported magnet a torque by this magnetic field. This cross-coil meter is widely used in, for example, a speedometer and a tachometer of a motor vehicle.

FIGS. 5 and 6 of the accompanying drawings show the general construction of this conventional cross-coil meter.

As shown in FIG. 5, a pair of excitation coils $L_s$, $L_c$ disposed so as to be perpendicular to each other generate a magnetic field as a pulse current according to the input quantity such as of a speedometer flows therethrough, and a angularly movable permanent magnet M receives a torque due to the magnetic field generated by the two excitation coils $L_s$, $L_c$.

Then a pointer fixed on the permanent magnet M is angularly moved through $\theta$ from a reference position to indicate a predetermined position of a scale plate on which scale marks represent physical quantity (speed in FIG. 6) to be measured and shows a directive value according to the inputted quantity.

A conventional meter drive apparatus for driving the cross-coil meter to be used in a speedometer such as of a motor vehicle inputs usually a pulse signal varying in frequency according to the inputted quantity such as speed. The conventional meter drive apparatus also uses predetermined periodic reference clock signals to be generated by a reference clock generating means and counts the number of pulses of the reference clock signals, which are generated in a cycle of the pulse signal, to calculate the frequency of the pulse signal.

Further the conventional meter drive apparatus supplies to the two mutually perpendicular excitation coils $L_s$, $L_c$ a current PWM-modulated based on the calculated frequency.

FIG. 7 shows the PWM waveform.

For supplying to the excitation coils $L_s$, $L_c$ a current according to the frequency of the input pulse signal, angle indices $\theta$ corresponding to some input quantity values S are predetermined and these values (S, $\theta$) are stored in a ROM. When calculating an angle of index $\theta$ according to the input quantity value S to be indicated, a parameter is read from the ROM and $\theta$ is calculated according to a predetermined equation stored in the ROM, whereupon a predetermined operating process is performed to cause a current to flow according to the calculated $\theta$. This prior art is exemplified by Japanese Patent application No. HEI 1-332280.

As mentioned above, in the conventional cross-coil meter, since a PWM-modulated current, i.e. a current of FIG. 7, is supplied through the excitation coils $L_s$, $L_c$, a magnetic field generated by the excitation coils $L_s$, $L_c$ will also vary in the same cycle as the cycle of PWM. The mechanical system of the meter angularly moves according to the change of this magnetic field and at that time, if the frequency of the magnetic field change coincides with the resonant frequency of the mechanical system, the mechanical system resonates to generate a buzzing noise.

For preventing this buzzing, the base frequency of the field change should be outside the audible frequency range, i.e. usually higher than 20 kHz. Accordingly a cycle of a PWM signal should be less than 50 $\mu$sec (=1/20 kHz). If the resolution of 10 bits (=1024) is to be obtained in this cycle, the number of reference clocks should be 48 nsec (=50 $\mu$sec/1024), i.e. 20.5 MHz.

Although it is not impossible to design a CMOS circuit which is operable at a frequency of higher than 20 MHz, it could have been easy by far to design the CMOS circuit of a compact size, if the operating frequency was 6.144 MHz, i.e. lower than $\frac{1}{3}$.

SUMMARY OF THE INVENTION

It is therefore an object of this invention to provide a PWM modulation circuit which reduces buzzing noise by using a currently very popular CMOS circuit, without adding a considerable design change to a conventional PWM modulation circuit.

According to this invention, there is provided a meter drive apparatus equipped with means for generating first parallel data indicating a directive value of a meter, the apparatus comprising: a counter for counting reference clocks to generate second parallel data; means for cylindrically bit-shifting the second parallel data to generate third parallel data; a comparator for comparing the first parallel data with the third parallel to output a binary output according to the result of comparison; and means for controlling the directive of the meter based on the output of the comparator.

With this apparatus, it is possible to suppress the reference clock to a relatively low frequency and to increase the effective frequency of a signal to be used in controlling the directive of the meter. By the above-mentioned cyclic bit-shifting, it is possible to obtain a signal higher in frequency, compared to the case in which the first parallel data is directly used in controlling the directive. For example, if the number of shifted bits is 4 bits, the output of the comparator would have a frequency four times the conventional frequency. Therefore it is possible to construct the circuit by using a low-frequency CMOS device, which is inexpensive.

In the cross-coil meter, since the sine coil and the cosine coil are used as the drive coils, the sine first parallel data and the cosine first parallel data are generated as the first parallel data. In this case, the sine comparator and the cosine comparator are used as the comparators.

Since wires for cyclically bit-shifting the second parallel data and for supplying the bit-shifted data to the comparator are used as the third parallel data generating means, only a small change to be added to the conventional circuit is necessary.

Instead of this third parallel data generating means, a reference clock input position change-over circuit may be used. The counter may include a number of counting devices associated with the respective bits of the third parallel data so that the reference clock is inputted to any of the counting devices. The counting device to which the reference clock is to be inputted is designated by a change-over signal from the reference clock input signal change-over circuit. Each counting device inputs a carry signal to a counting device corresponding to an immediately upper significant bit, without inputting any carry signal to the counting device to which the reference clock is to be inputted. The reference clock input position change-over circuit changes the counting device to which the reference clock is to be inputted, by generating a change-over signal based on an external signal. A flip-flop may be used as the counting device.

The reference clock input position change-over circuit can be realized by using a number of selectors associated with the respective counting devices corresponding to the succeeding bits. Each selector selects the reference clock or the carry signal from the counting device corresponding to an immediately lower significant bit according to the external signal and supplies it to the associated counting device.

Further the reference clock input signal change-over circuit may be equipped with a circuit for expanding the number of bits of the external signal to generate a control signal for controlling the selecting operation in each selector.

The controller including the sine first parallel data generating means and the cosine first parallel data generating means may be used. In this case, the directive controlling means determines a directive quadrant based on the quadrant change-over signal from the controller. Specifically, the directive quadrant is determined by the sine steering logic and the cosine steering logic. The sine steering logic determines the sign of a current to be supplied to the sine coil of the cross-coil meter, based on the quadrant change-over signal. The cosine steering logic determines the sign of a current to be supplied to the cosine coil of the cross-coil meter, based on the quadrant change-over signal. The current to be supplied to the sine coil of the cross-coil meter is a current having both the sign determined by the sine steering logic and the pulse width according to the output of the sine comparator, and the current to be supplied to the cosine coil of the cross-coil meter is a current having both the sign determined by the cosine steering logic and the pulse width according to the output of the cosine comparator. The driving of the meter with this PWM signal is executed by the sine driver and the cosine driver.

According to this invention, a meter apparatus equipped with a meter can be realized.

DETAILED DESCRIPTION

Embodiments of this invention will now be described with reference to the accompanying drawings.

Figure 1:
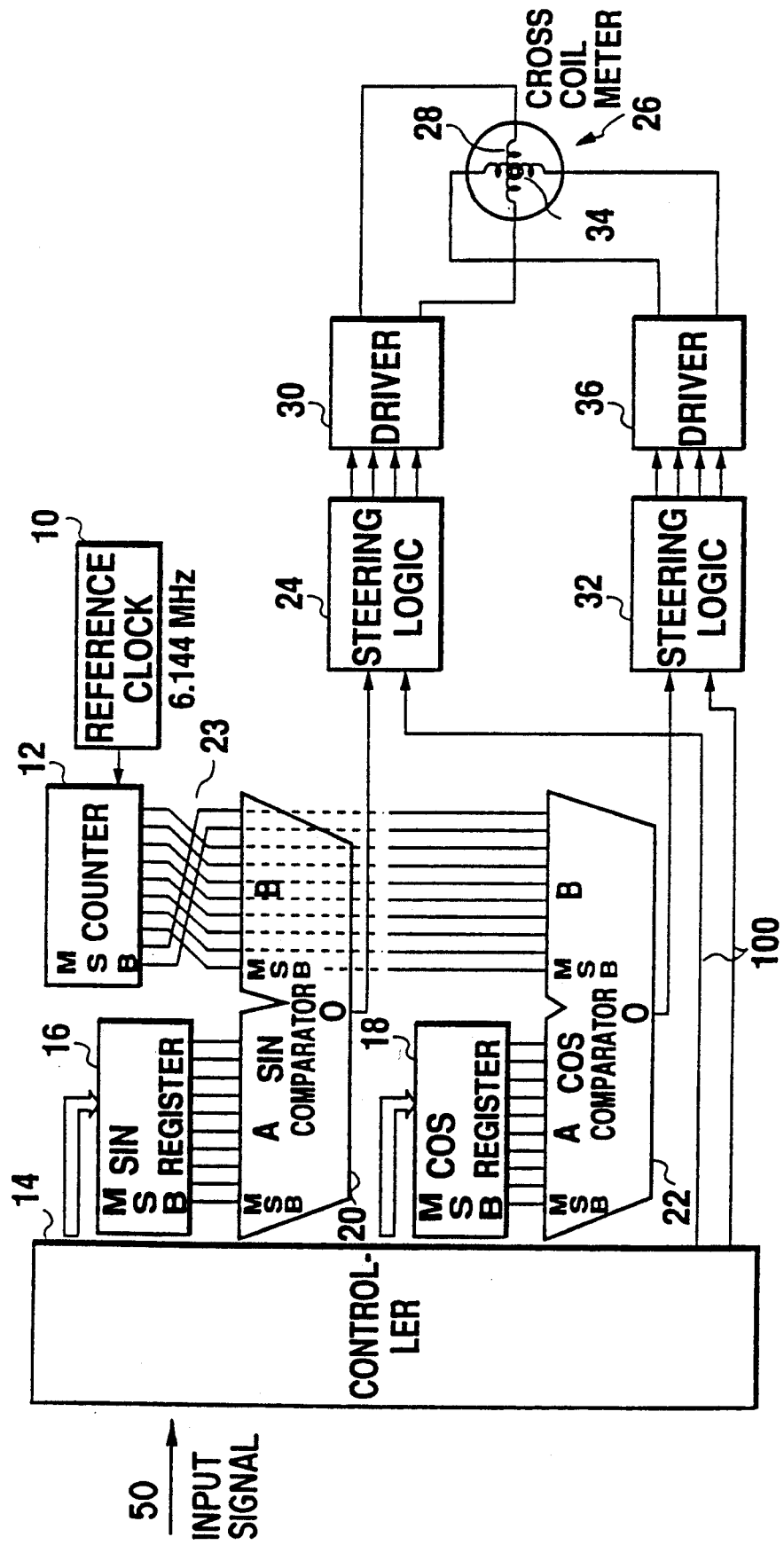
FIG. 1 is a block diagram showing a PWM modulation circuit according to one embodiment of this invention.

FIG. 1 is a block diagram showing a first embodiment of this invention.

A PWM modulation circuit of the first embodiment has a reference clock generator 10 for generating reference clock signals (6.144 MHz). To the reference clock generator 10, a 10-bit binary counter 12, to which reference clock signals are to be inputted, is connected.

Figure 5:
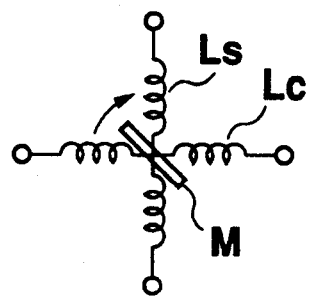
FIG. 5 is a view showing excitation coils.
Figure 6:
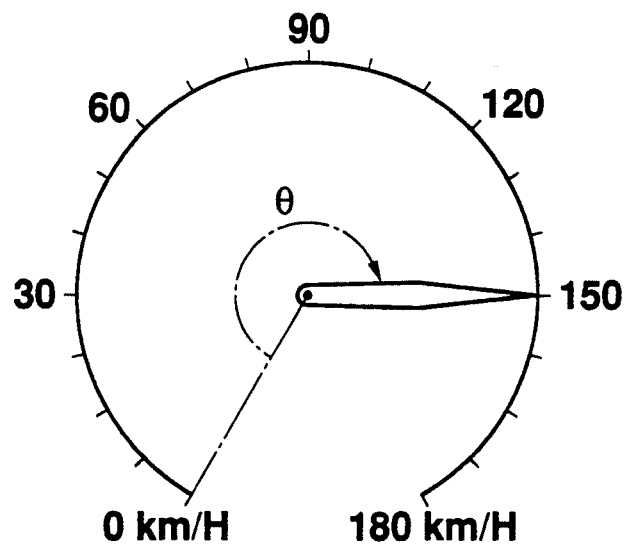
FIG. 6 is a view showing a cross-coil meter.
Figure 7:
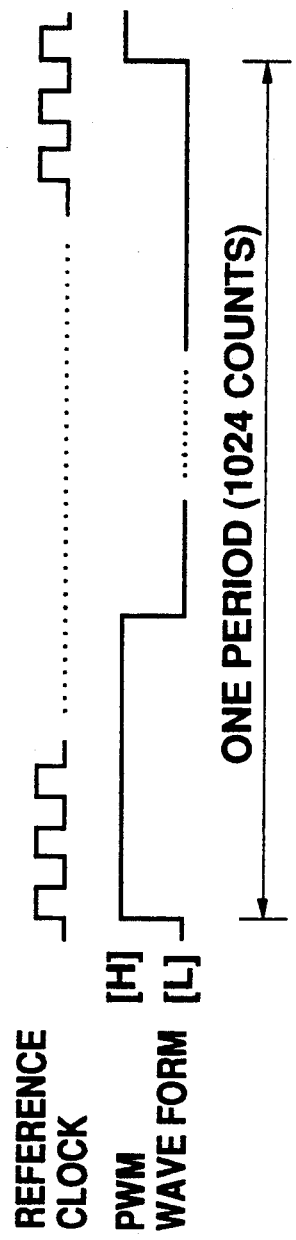
FIG. 7 is a diagram showing a PWM output waveform.

The PWM modulation circuit also has a controller 14. To the controller 14, a sine register 16 and a cosine register 18 for storing directive values outputted from the controller 14 are connected. An input signal 50 is input to the controller 14. The input signal 50, as in the conventional apparatus shown in FIG. 5, is a pulse signal varying in frequency according to an input quantity such as vehicle speed or crankshaft rotational speed.

Connected to the sine register 16 and the binary counter 12 is a sine comparator 20 for comparing the output of the sine register 16 with the output from the wires 23 to output an "L" signal, when the output of the sine register 16 is less than the output from the wires 23, and to output an "H" signal, when the output of the sine register 16 exceeds the output from the wires 23.

Connected to the cosine register 18 and the binary counter 12 is a cosine comparator 22 for comparing the output of the cosine register 18 with the output from the wires 23 to output an "L" signal, when the output of the cosine register 18 is less than the output from the wires 23, and to output an "H" signal, when the output of the cosine register 18 exceeds the output from the wires 23.

The binary counter 12 and the sine comparator 20 are interconnected by wires 23 through which the whole output of the binary counter 12 is 2-bit-shifted from the most significant 2 bits toward the least significant 2 bits.

Similarly, the binary counter 12 and the cosine comparator 22 are interconnected by wires 23 through which the whole output of the binary counter 12 is 2-bit-shifted from the most significant 2 bits toward the least significant 2 bits.

To the sine comparator 20 and the controller 14, steering logic 24 for determining the sign of a current to be supplied to an excitation coil 28 of a cross-coil meter 26 based on the output of the sine comparator 20 is connected. To the steering logic 24, a driver 30 for driving the sine excitation coil 28 of the cross-coil meter 26 is connected.

Similarly, to the cosine comparator 22 and the controller 14, steering logic 32 for determining the sign of a current to be supplied to a cosine excitation coil 34 of the cross-coil meter 26 based on the output of the cosine comparator 22 is connected. To the steering logic 32, a driver 36 for driving the cosine excitation coil 34 of the cross-coil meter 26 is connected.

Figure 2:
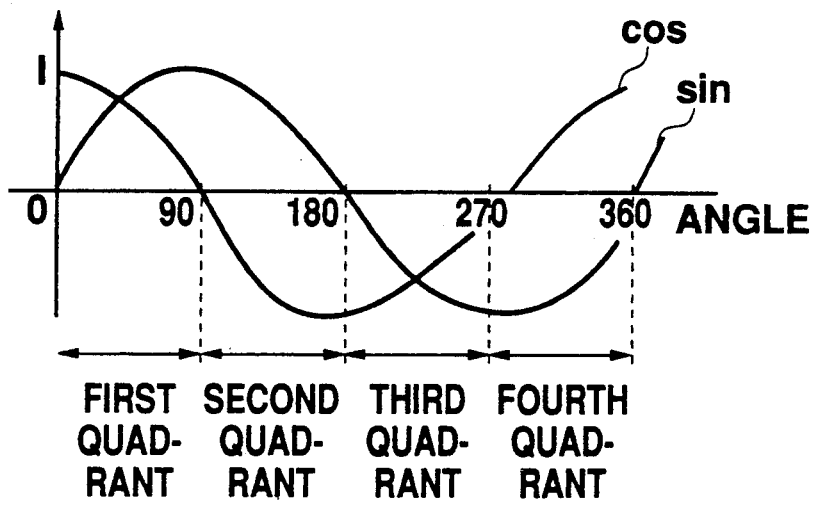
FIG. 2 is a diagram showing positive and negative signs in steering logics according to the embodiment.

As shown in FIG. 2, the first quadrant of the meter is defined by sine positive and cosine positive; the second quadrant, by sine positive and cosine negative the third quadrant, by sine negative and cosine negative; and the fourth quadrant, by sine negative and cosine positive.

The operation of the first embodiment will now be described.

The controller 14 inputs the sine component and the cosine component of a directive of the meter to the sine register 16 and the cosine register 18, respectively.

The reference clock generator 10 generates reference clock signals (6.144 MHz) to be inputted to the 10-bit binary counter 12 where the number of the inputted reference clock signals are counted.

The sine comparator 20 compares the output of the sine register 16 with the output of the binary counter 12 and outputs an "L" signal, when the output of the sine register 16 is less than the output of the binary counter 12, and outputs an "H" signal, when the output of the sine register 16 exceeds the output of the binary counter 12.

Figure 3:
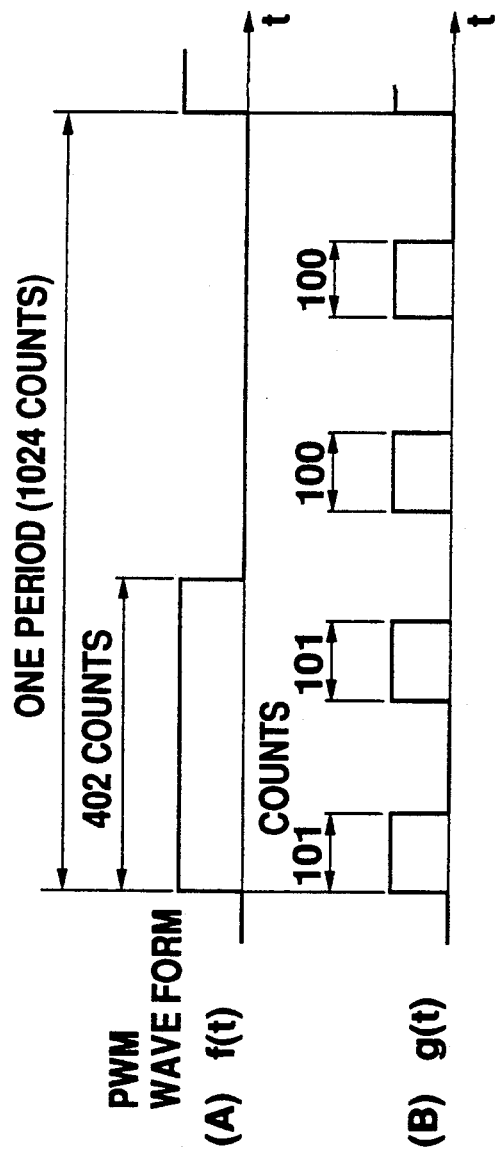
FIG. 3 is a diagram showing the operation of the PWM modulation circuit according to the embodiment.

FIG. 3(A) shows an example in which 402 "H" count signals are outputted. A function representing the waveform of this signal is defined as f(t). f(t) corresponds to the waveform which is obtained by directly PWM-modulating the input to the register 16 or 18.

In this embodiment, since the whole output of the binary counter 12 is 2-bit-shifted from the most significant 2 bits toward the least significant 2 bits, the PWM-modulated waveform obtained by quartering the waveform of f(t) into 101, 101, 100, 100, as shown in FIG. 3(B) results. A function representing this waveform is defined as g(t).

The amplitudes of the base frequency component (6 kHz) and the secondary and tertiary high frequency components of this g(t) are very small, and those of the quartic high frequency component (24 kHz) and over are chief components. Therefore the chief component of the PWM waveform can be determined in the range of 6 kHz to 24 kHz, which is outside the audible range. At this time, the most significant 2 bits are shifted toward the least significant side; this invention is similar to the prior art circuit except that the whole output is 2-bit-shifted.

The thus obtained output of the sine comparator 20 is inputted to the steering logic 24 where it is synthesized with a quadrant change-over signal 100 outputted from the controller 14 and the sign of the sine output is determined.

From the cosine comparator 22, the quartered PWM waveform can be obtained in the manner as described above in connection with the sine comparator 20. This output is inputted to the steering logic 32 where the output is synthesized with the quadrant change-over signal 100 to be outputted from the controller 14 and the sign of the cosine output is determined.

The driver 30 supplies to the sine excitation coil 28 a current corresponding to the output of the steering logic 24, and the driver 36 supplies to the cosine excitation coil 34 a current corresponding to the output of the steering logic 32.

In this embodiment, the output of the binary counter 12 is 2-bit-shifted from the most significant 2 bits toward the least significant 2 bits to quarter one cycle output of the comparator. According to this invention, the number of bits to be shifted should by no means be limited to 2 bits.

Figure 4:
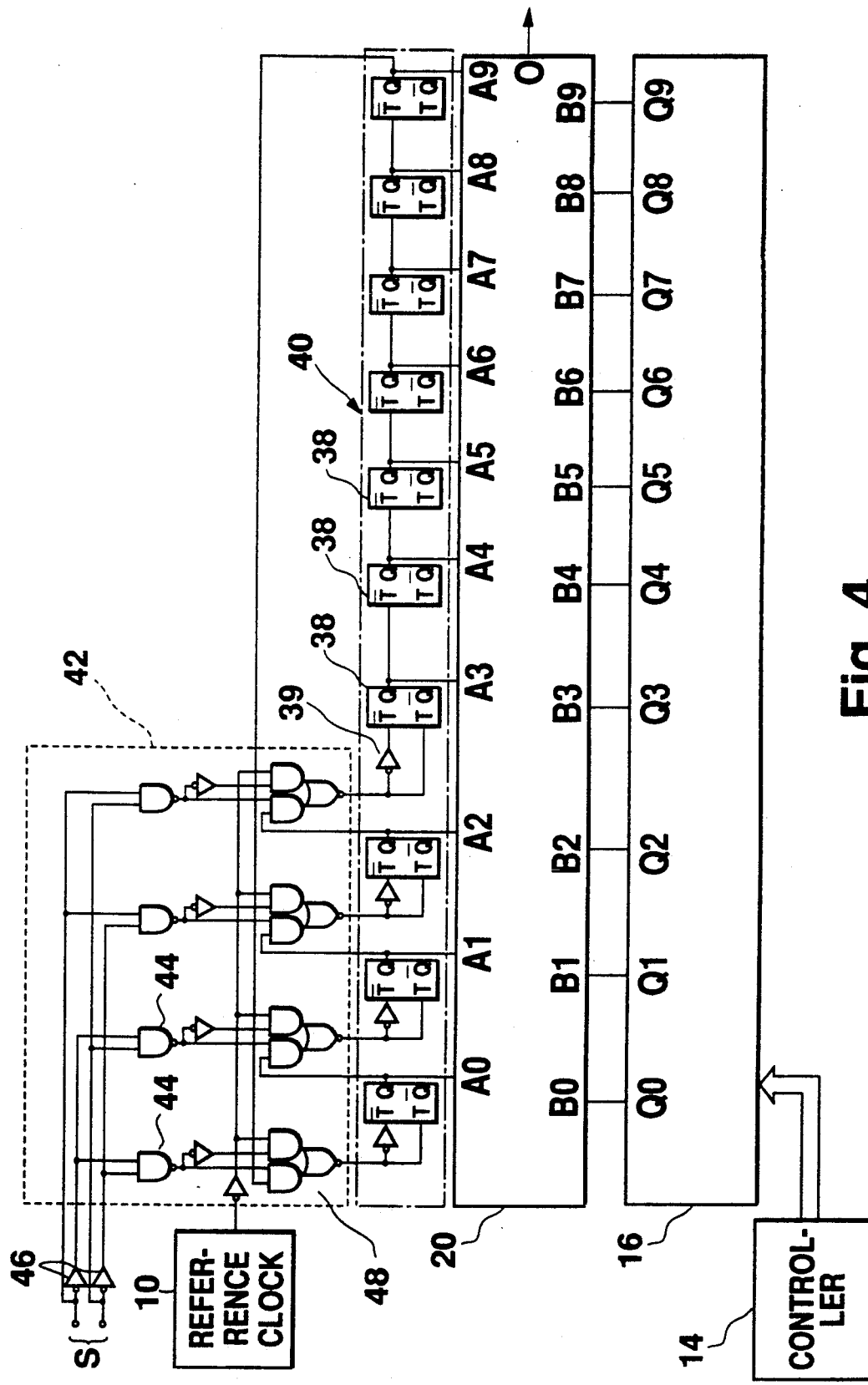
FIG. 4 is a block diagram showing a modified PWM modulation circuit according to another embodiment of the invention.

FIG. 4 shows a modified PWM modulation circuit according to a second embodiment of this invention.

The PWM modulation circuit is similar in construction to the first embodiment except for a reference clock input position change-over circuit 42 located in front of a counter 40, to replace the cross wiring function of 23.

The counter includes ten T flip-flops 38 connected using four inverters 39. The Q output terminals of the T flip-flops 38 are respectively connected to the input ports A0–A9 of the sine comparator 20 and the input port (not shown) of the cosine comparator 22.

Out of the ten T flip-flops 38, seven T flip-flops 38 whose Q output terminals are connected to the input ports A3–A9, i.e. the upper seven bits, are cascade-connected in order. Namely the Q output terminal of the lower significant T flip-flop 38 is connected to the T input terminal of the immediately upper significant T flip-flop 38, and the Q output terminal of the lower significant T flip-flop 38 is connected to the T input terminal of the immediately upper T flip-flop 38.

To the four T flip-flops 38 whose Q output terminal are connected to the input ports A0–A3, the outputs of the reference clock input position change-over circuit 42 are inputted. Namely to the T input terminal of these four T flip-flops 38, any of the outputs of the reference clock input position change-over circuit 42 is inputted to the T input terminal of the four T flip-flops 38 via the inverter 39 and directly. The outputs from the Q output terminals of the four T flip-flops 38 are inputted to the reference clock input position change-over circuit 42.

The reference clock input position change-over circuit 42 is a circuit to which a bit change-over signal S is to be inputted from an external source and which determines the number of shifted bits based on the signal S. In this embodiment, the output of the reference clock input position change-over circuit 42 is $4 = 2^2$ bits, according to which the signal S is 2 bits. Generally, if the number of the output bits of the reference clock input position change-over circuit 42 is to be $2^n$ bits, the signal S should be n bits.

The reference clock input position change-over circuit 42 has four NAND gates 44. These four NAND gates 44 define, with two inverters 46 located in front of the reference clock input position change-over circuit 42, means for converting a bit change-over signal of 2 bits into 4 bits. Therefore the upper significant bits (bits regarding the input lines shown in the upper portion of FIG. 4) of the bit change-over signal S are inputted to NAND gates 44 of the lower 2 bits via the inverters 46 and directly. Likewise the lower significant bits (bits regarding the input lines shown in the lower portion of FIG. 4) of the bit change-over signal S are inputted to the NAND gates 44 of even-numbered bits via the inverters 46 and to the NAND gates of odd-numbered bits directly.

The output terminal of the NAND gates 44 are respectively connected to four selectors 48. Each selector 48 is a means for making a change-over, based on the output of the associated NAND gate 44, between outputting a carry signal from the lower significant bits to the T flip-flop 38 and outputting a reference clock from the reference clock generator 10 to the T flip-flop 38.

More specifically, each selector 48 includes an inverter for inverting the output of the NAND gate 44, a NAND gate to which the output of the NAND gate 44 and a carry signal from the immediately lower significant T flip-flop 38 are to be inputted, an AND gate to which an inverted value of the output of the NAND gate 44 and an inverted value of a reference clock signal are to be inputted, and a NOR gate to which the outputs of these two AND gates are to be inputted.

Therefore, if the output of the associated NAND gate 44 is an "L" value, the output of the NOR gate of the selector 48 will be an inverted value of the reference clock signal; if it is an "H" value, the output of the NOR gate of the selector 48 will be an inverted value of the carry signal from the immediately lower significant T flip-flop 38.

Since the reference clock input position change-over circuit 42 and the counter 40 are thus constructed. It is possible to control the number of shift bits by the signal S during cyclic bit-shifting, which is a significant feature of this invention.

For example, when either the upper significant bits or the lower significant bits of the signal S are an "L"

value, a reference signal is inputted to the $\overline{T}$ input terminal of the T flip-flop 38 associated with the input port A0, and a carry signal from the Q output terminal of the immediately lower significant T flip-flop 38 is inputted to the $\overline{T}$ input terminals of the nine T flip-flops 38 associated with the input ports A1–A9. In this case, the input of the comparator 20 is not shifted.

Similarly, when the upper significant bits of the signal S are an "L" value and when the lower significant bits are an "H" value, a reference clock signal is inputted to the $\overline{T}$ input terminal of the T flip-flop 38 associated with the input port A1, and a carry signal from the Q output terminal of the nine T flip-flops 38 of immediately lower significant bits is inputted. In this case, therefore, the input of the comparator 20 is one which has the upper significant 1 bit among the output of 10 bits of the counter shifted to the least significant bits and other bits shifted 1 bit by 1 bit to the upper significant bits.

Further, when the upper significant bits of the signal S are an "H" value and when the lower significant bits are an "'L" value, a reference clock signal is inputted to the $\overline{T}$ input terminal of the T flip-flop 38 associated with the input port A2, and a carry signal from the Q output terminal of the immediately significant $\overline{T}$ flip-flop 38 is inputted to the T input terminals of the nine T flip-flops 38 associated with the input ports A3–A9 and A0–A1. In this case, therefore, the input of the comparator 20 is one which has the upper significant 2 bits among the output of 10 bits of the counter shifted to the least significant bits and other bits shifted 2 bits by 2 bits to the upper significant bits.

Furthermore, when either the upper significant bits or the lower significant bits of the signal S are an "H" value, a reference clock signal is inputted to the $\overline{T}$ input terminal of the T flip-flop 38 associated with the input port A3, and a carry signal from the Q output terminal of the immediately lower significant T flip-flop 38 is inputted to the $\overline{T}$ input terminal of the nine T flip-flops 38 associated with the input port A4–A9 and A0–A2. In this case, therefore, the input of the comparator 20 is one which has the upper significant 3 bits among the output of 10 bits of the counter shifted to the least significant bits and other bits shifted by 3 bits by 3 bits to the upper significant bits.

In FIG. 4, reference character 0 designates an output port of the comparator 20.

According to this embodiment, the cyclic bit-shifting, which is a significant feature of this invention, can be realized with the range in which the number of shifted bits is 4 bits. This operation can be realized without actually changing the wiring between the counter 40 and the comparator 20. The number of shifted bits may be selected depending on the design.

According to this invention, as described above, since several bits from the most significant bits of the binary counter are shifted to the lower significant bits to increase an effective frequency of the PWM signal by cyclically bit-shifting, it is possible to determine an effective frequency of the PWM signal to be outside the audible range, with required solution maintained, thus preventing any buzzing noise due to the resonance of a cross-coil meter.

What is claimed is:

1. A meter drive apparatus equipped with means for generating first parallel data indicating a directive value of a meter, said apparatus comprising:
    (a) a counter for counting reference clocks to generate second parallel data;
    (b) means for cyclically bit-shifting the second parallel data to generate third parallel data;
    (c) a comparator for comparing the first parallel data with the third parallel to output a binary output according to the result of comparison; and
    (d) means for controlling the directive of the meter based on the output of said comparator.

2. A meter drive apparatus according to claim 1, wherein said third parallel data generating means includes wires for cyclically bit-shifting the second parallel data and for supplying the bit-shifted second parallel data to said comparator.

3. A meter drive apparatus according to claim 1, wherein said counter includes a number of counting devices corresponding to each bit of the third parallel data, one of said counting devices directed by a change-over signal being adapted to receive the reference clocks, each of said counting devices, except one corresponding to a lower significant bit immediately lower than said one counting device, being adapted to input a carry signal to the counting device corresponding to an upper significant bit immediately higher than said one counting device, and
    wherein said third parallel data generating means includes a reference clock input position change-over circuit for generating a change-over signal, based on an external signal, to input the reference clocks to one of said counting devices.

4. A meter drive apparatus according to claim 3, wherein each of said counting elements is a flip-flop.

5. A meter drive apparatus according to claim 3, wherein said reference clock input position change-over circuit includes selectors associated with the respective counting devices corresponding to the succeeding bits, each of said selectors being adapted to select, according to the external signal, the reference clocks or the carry signal from the counting signal corresponding to the lower significant bit immediately lower than said one counting device and to supply the selected one to the associated counting device.

6. A meter drive apparatus according to claim 5, wherein said reference clock input position change-over circuit includes a circuit for expanding the number of bits of the external signal to generate a control signal to control the selecting operation of each said selector.

7. A meter drive apparatus equipped with means for generating a sine first parallel data indicating a current to be supplied to a sine coil of a cross-coil meter and means for generating cosine first parallel data indicating a current to be supplied to a cosine coil of the cross-coil meter, said apparatus comprising:
    (a) a counter for counting reference clocks to generate second parallel data;
    (b) means for cyclically bit-shifting the second parallel data to generate third parallel data;
    (c) a sine comparator for comparing the sine first parallel data with the third parallel data to output a binary output according to the result of comparison;
    (d) a cosine comparator for comparing the cosine first parallel data with the third parallel data to output a binary output according to the result of comparison; and
    (e) means for controlling the directive of the cross-coil meter based on the outputs of said sine comparator and said cosine comparator.

8. A meter drive apparatus according to claim 7, wherein said third parallel data generating means includes wires for cyclically bit-shifting the second parallel data and for supplying the bit-shifted second parallel data to said sine comparator and said cosine comparator.

9. A meter drive apparatus according to claim 7, wherein said counter includes a number of counting devices corresponding to each bit of the third parallel data, one of said counting devices directed by a change-over signal being adapted to receive the reference clocks, each of said counting devices, except one corresponding to a lower significant bit immediately lower than said one counting device, being adapted to input a carry signal to the counting device corresponding to an upper significant bit immediately higher than said one counting device, and wherein said third parallel data generating means includes a reference clock input position change-over circuit for generating a change-over signal, based on an external signal, to input the reference clocks to one of said counting devices.

10. A meter drive apparatus according to claim 9, wherein each of said counting elements is a flip-flop.

11. A meter drive apparatus according to claim 9, wherein said reference clock input position change-over circuit includes selectors associated with the respective counting devices corresponding to the succeeding bits, each of said selectors being adapted to select, according to the external signal, the reference clocks or the carry signal from the counting signal corresponding to the lower significant bit immediately lower than said one counting device and to supply the selected one to the associated counting device.

12. A meter drive apparatus according to claim 11, wherein said reference clock input position change-over circuit includes a circuit for expanding the number of bits of the external signal to generate a control signal to control the selecting operation of each said selector.

13. A meter drive apparatus according to claim 7, further comprising a controller including the sine first parallel data generating means and the cosine first parallel data generating means.

14. A meter drive apparatus according to claim 13, wherein said controller outputs a quadrant change-over signal indicating a directive quadrant, and said directive controlling means determines a directive quadrant based on the quadrant change-over signal outputted from said controller.

15. A meter drive apparatus according to claim 14, wherein said directive controlling means includes:
sine steering logic for determining a sign of the current to be supplied to the sine coil of the cross-coil meter based on the quadrant change-over signal; and
cosine steering logic for determining a sign of the current to be supplied to the cosine coil of the cross-coil meter based on the quadrant signal.

16. A meter drive apparatus according to claim 14, wherein said directive controlling means includes:
a sine driver for supplying to the sine coil of the cross-coil meter an effective current according to the output of said sine comparator; and
a cosine driver for supplying to the cosine coil of the cross-coil meter an effective current according to the output of said cosine comparator.

17. A meter drive apparatus according to claim 14, wherein said directive controlling means includes:
a sine driver for supplying to the sine coil of the cross-coil meter a current having a pulse width according to the sign determined by said sine steering logic and the output of said sine comparator; and
a cosine driver for supplying to the cosine coil of the cross-coil meter a current having a pulse width according to the sign determined by the cosine steering logic and the output of said cosine comparator.

18. A meter apparatus equipped with a meter and means for generating first parallel data indicating an directive value of the meter, said meter apparatus comprising:
(a) a counter for counting reference clocks to generate second parallel data;
(b) means for cyclically bit-shifting the second parallel data to generate third parallel data;
(c) a comparator for comparing the first parallel data with the third parallel data and for outputting a binary output according to the result of comparison; and
(d) means for controlling the directive of said meter based on the output of said comparator.

* * * * *